US012241934B2

(12) United States Patent
Bavois et al.

(10) Patent No.: US 12,241,934 B2
(45) Date of Patent: Mar. 4, 2025

(54) METHOD FOR SUPPLYING POWER TO AN INDUCTIVE LOAD

(71) Applicant: VITESCO TECHNOLOGIES GMBH, Hanover (DE)

(72) Inventors: Thierry Bavois, Toulouse (FR); Florence Capy, Toulouse (FR); Angelo Pasqualetto, Toulouse (FR)

(73) Assignee: VITESCO TECHNOLOGIES GMBH, Hanover (DE)

(*) Notice: Subject to any disclaimer, the term of this patent is extended or adjusted under 35 U.S.C. 154(b) by 596 days.

(21) Appl. No.: 17/288,451

(22) PCT Filed: Oct. 25, 2019

(86) PCT No.: PCT/EP2019/079138
§ 371 (c)(1),
(2) Date: Apr. 23, 2021

(87) PCT Pub. No.: WO2020/084106
PCT Pub. Date: Apr. 30, 2020

(65) Prior Publication Data
US 2021/0382110 A1     Dec. 9, 2021

(30) Foreign Application Priority Data
Oct. 26, 2018 (FR) .................................... 1859926

(51) Int. Cl.
*G01R 31/327* (2006.01)
*G01R 19/165* (2006.01)
(Continued)

(52) U.S. Cl.
CPC ..... *G01R 31/327* (2013.01); *G01R 19/16571* (2013.01); *G01R 31/52* (2020.01); *H02P 29/024* (2013.01)

(58) Field of Classification Search
CPC ...... G01R 31/52; G01R 31/327; G01R 31/00; G01R 31/26; G01R 31/27; G01R 31/34;
(Continued)

(56) References Cited

U.S. PATENT DOCUMENTS 5,629,588 A * 5/1997 Oda .................... H05B 41/2921
  315/307
6,056,384 A * 5/2000 Sato .......................... H02P 7/04
  318/400.29

(Continued)

FOREIGN PATENT DOCUMENTS

DE  10 2006 030 594   1/2008
DE  10 2016 220 030   4/2018
(Continued)

OTHER PUBLICATIONS

International Search Report for PCT/EP2019/079138 dated Jan. 14, 2020, 7 pages.
(Continued)

*Primary Examiner* — Hoai-An D. Nguyen
(74) *Attorney, Agent, or Firm* — NIXON & VANDERHYE

(57) ABSTRACT

A method for supplying power to an inductive load (12) using an H-bridge (2) power supply structure, comprising a first block B1 of steps for detecting an anomaly using a "DIAG ON" diagnostic method, a second block B2 of steps for detecting an anomaly using a "DIAG OFF" diagnostic method, and finally a third block B3 of steps for discriminating the detected anomaly and for confirming a short circuit at the inductive load (12) anomaly.

6 Claims, 6 Drawing Sheets

Figure 1:
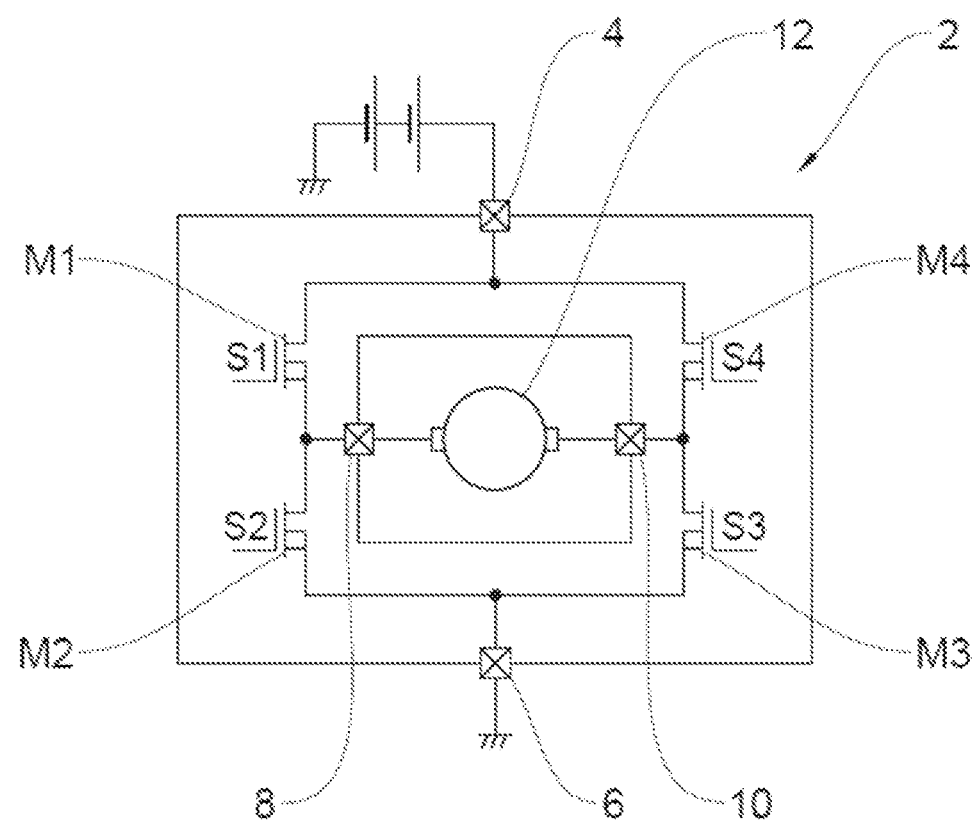

(51) Int. Cl.
*G01R 31/52* (2020.01)
*H02P 29/024* (2016.01)

(58) Field of Classification Search
CPC ...... G01R 31/50; G01R 19/00; G01R 19/165; G01R 19/16566; G01R 19/16571; H02P 29/00; H02P 29/02; H02P 29/024
USPC .......................................... 324/415
See application file for complete search history.

(56) References Cited

U.S. PATENT DOCUMENTS

| | | | |
|---|---|---|---|
| 6,998,848 B2* | 2/2006 | Kereit | G01R 31/52 |
| | | | 324/509 |
| 9,350,156 B2* | 5/2016 | Kanzaki | H02H 3/08 |
| 10,479,402 B2 | 11/2019 | Pasqualetto | |
| 2006/0294425 A1 | 12/2006 | Kollner et al. | |
| 2008/0143340 A1* | 6/2008 | Forster | G01R 31/54 |
| | | | 324/543 |
| 2010/0052538 A1 | 3/2010 | Tanaka et al. | |
| 2013/0083434 A1* | 4/2013 | Barth | G01R 31/346 |
| | | | 361/31 |
| 2014/0333320 A1* | 11/2014 | Barnetova | G01R 31/66 |
| | | | 324/503 |
| 2017/0012530 A1* | 1/2017 | Pasqualetto | H02M 3/158 |
| 2019/0225259 A1 | 7/2019 | Pasqualetto | |
| 2024/0299734 A1* | 9/2024 | Wang | A61N 1/025 |

FOREIGN PATENT DOCUMENTS

| | | | | |
|---|---|---|---|---|
| FR | 3 056 039 | | 3/2018 | |
| WO | 2008/003534 | | 1/2008 | |
| WO | 2018/050991 | | 3/2018 | |
| WO | PCT/FR2017/052399 | * | 3/2018 | ................ H02P 7/03 |
| WO | 2018/069074 | | 4/2018 | |
| WO | WO-2019073773 A1 | * | 4/2019 | ............. H02P 27/08 |

OTHER PUBLICATIONS

Written Opinion of the ISA for PCT/EP2019/079138 dated Jan. 14, 2020, 6 pages.

* cited by examiner

METHOD FOR SUPPLYING POWER TO AN INDUCTIVE LOAD

CROSS-REFERENCE TO RELATED APPLICATIONS

This application is the U.S. national phase of International Application No. PCT/EP2019/079138 filed Oct. 25, 2019 which designated the U.S. and claims priority to FR 1859926 filed Oct. 26, 2018, the entire contents of each of which are hereby incorporated by reference.

The present invention relates in general to the supply of power to an inductive load. It relates more particularly to the detection of an anomaly or anomalies, such as for example a short circuit that may occur at an inductive load controlled using a switching structure, such as for example a bridge of switches, or also called an H-bridge.

The invention is applicable in particular in the automotive field.

In modern motor vehicles, it is known to drive loads, such as actuators, by way of H-bridges. As is known, an H-bridge comprises a first arm and a second arm that are arranged in parallel with one another. Each of said first arm and second arm comprises what is called a "high-side switch" and what is called a "low-side switch" that are separated by a center tap. The high-side switches are coupled to an electric power source, and the low-side switches are coupled to an electrical ground line. The load is arranged between center taps of the first arm and of the second arm.

Generally speaking, the H-bridge may be put into multiple states in order to drive the load. In particular, the H-bridge may be put into a first activation state and into a second activation state in which the current flows, through the load, from the supply line to the electrical ground line. In the first activation state, the high-side switch of the first arm and the low-side switch of the second arm are in an on state, while the high-side switch of the second arm and the low-side switch of the first arm are in an off state. In the second activation state, the high-side switch of the second arm and the low-side switch of the first arm are in the on state, while the high-side switch of the first arm and the low-side switch of the second arm are in the off state. The flow direction of the current in the load in the first activation state is therefore opposite to the flow direction of the current in the second activation state. For example, if the load is an electric motor, this makes it possible in particular to drive said electric motor in rotation in one direction or the other.

It is known practice to regularly diagnose the various components of the H-bridge, in order to detect any anomaly and in particular a short circuit on the load anomaly. This type of anomaly has to be able to be detected since, firstly, this means that the load is possibly damaged and, secondly, this may cause an overcurrent in the current flowing in the H-bridge, which may damage the components of said H-bridge.

In order to detect a short circuit on the load, it is known practice, when the H-bridge is put into the first activation state or into the second activation state, to measure the current, called "low-side current", flowing in the low-side switch in the on state and the current, called "high-side current", flowing in the high-side switch in the on state of the H-bridge. When the H-bridge is put into the first activation state or the second activation state, the low-side current and the high-side current are in principle non-zero. On the other hand, in the event of a short circuit on the load, the strength of the low-side current and the strength of the high-side current increase rapidly and simultaneously until reaching excessively high values, called an overcurrent. Thus, if the low-side current or the high-side current become excessively large, then it is possible for the load to be short-circuited thereby. This type of diagnosis is generally referred to as an anomaly detection method for switches in the "ON" state, or also known by the acronym "DIAG ON".

However, numerous factors mean that, in the event of a short circuit on the load, an overcurrent will not be detected simultaneously on the low-side current and on the high-side current. In particular, the measurements of the low-side current and of the high-side current are not always synchronous, such that one of the currents from among the low-side current and the high-side current may exhibit an overcurrent before the other one. The problem then lies in the fact that, as soon as an overcurrent is detected on one of the currents from among the low-side current and the high-side current, the various electronic components of the H-bridge are stopped in order to avoid them being damaged. It is thus not possible to ascertain whether the other current might also exhibit an overcurrent, and it is therefore not possible to determine with certainty the type of anomaly.

In such a case, an overcurrent is detected only on a single current from among the high-side current and the low-side current. A short circuit on the load may thus be confused with:
- if an overcurrent has been detected on the high-side current: a short circuit between the high-side switch and the electrical ground line,
- if an overcurrent has been detected on the low-side current: a short circuit between the supply line and the low-side switch.

The invention proposes a method for supplying power to an inductive load using an H-bridge power supply structure, comprising a first block B1 of steps for detecting an anomaly using a "DIAG ON" diagnostic method, a second block B2 of steps for detecting an anomaly using a "DIAG OFF" diagnostic method, and finally a third block B3 of steps for discriminating the detected anomaly and for confirming a short circuit at the inductive load anomaly.

It is proposed for the first block B1 of steps for detecting an anomaly using a "DIAG ON" diagnostic method to comprise a step of putting the H-bridge into an activation state from among a first activation state and a second activation state, a step of measuring successive values of the strength of a high-side current flowing in a high-side switch in the on state of the H-bridge, a step of measuring successive values of the strength of a low-side current flowing in a low-side switch in the on state of the H-bridge, and a step of evaluating a criterion for detecting an overcurrent of the low-side current or of the high-side current on the basis of the measured values.

In one exemplary embodiment, what is proposed is a step of recording the type of anomaly detected in relation to the overcurrent of the low-side current or of the high-side current that is detected.

The method for supplying power to an inductive load according to the invention comprises, in another variant embodiment, if an overcurrent is detected in the first block B1 of steps, for detecting an anomaly using a "DIAG OFF" diagnostic method, the following steps:
- e1) positioning the switches of an H-bridge in an off state,
- e2) verifying and awaiting the off state of all of the switches,
- e3) sequentially measuring a current flowing through each switch, if there is no current flowing through all of the switches, then moving to step e11), if at least one current is flowing through at least one switch, awaiting a first determined duration before performing a new measurement of the current flowing through each switch, then, if there is at least one current in at least one switch, then first of all identifying whether one of the two switches coupled to the positive power supply is being flowed through by said measured current, if one of said two switches is being flowed through by said current, moving to step e8), if neither of said two switches is being flowed through by a current, then identifying whether one of the two switches coupled to electrical ground is being flowed through by said measured current, if one of said two switches is being flowed through by said current, moving to step e10), e8) confirming the presence of a short circuit to a voltage level higher than the battery anomaly at at least one of the two high-side switches, e10) confirming the presence of a short circuit to a voltage level lower than ground anomaly at at least one of the two low-side switches, e11) detecting the presence of an electromotive force between the first control output and the second control output by measuring the voltages on the first control output and the second control output; if the measured voltages are equal, moving to step e12), if the measured voltages are different, then recording the difference between the first control output and the second control output corresponding to the electromotive force for controlling the connected load, step e13) furthermore comprises a step of awaiting a second determined duration before a new step of measuring the voltages on the first control output and on the second control output; if the measured voltages have equal values, then moving to step e12), otherwise implementing an alert, for example an electromotive force problem error, and stopping the execution of the method.

e12) coupling a first voltage generator and a second voltage generator to said control outputs, and then respectively applying a first voltage and a second voltage, e14) measuring the voltages on the first control output and on the second control output, if the measured voltage variations over time are outside a first measurement range, moving to step e16), if they are within the first measurement range, moving to step e20), e16) awaiting a third determined time before measuring the voltages on the first control output and on the second control output again, if the measured voltage variations are again outside the first measurement range, then declaring a frequency interference anomaly, if the measured voltage variations are within the first measurement range, moving to step e20), e20) measuring the currents flowing through the first control output and the second control output, if the difference between the two measured currents is within a second measurement range, then stopping the anomaly test and declaring no short circuit or open circuit anomaly, if not, then moving to step e23), e23) measuring the voltages of the two outputs; if the voltage measured on the first control output is different from the voltage measured on the second control output, then the detected anomaly is an open load anomaly, and stopping the execution of the method, otherwise moving to step e25), e25) measuring the voltages on the first control output and on the second control output, if the measured voltages are greater than the voltages generated by the voltage generators connected to the outputs, then generating an alert regarding the presence of a short circuit to the positive voltage anomaly, if the measured voltages are lower than the voltages generated by the voltage generators connected to the outputs, then generating an alert regarding the presence of a short circuit to electrical ground anomaly.

As a variant, a step of recording the type of anomaly detected is proposed.

What is also cleverly proposed, in order to improve the reliability of the diagnosis, is for the third block (B3) of steps to consist of a comparison between the results of anomalies obtained by the first block (B1) of steps and by the second block (B2) of steps and if:

the anomaly obtained by the first block (B1) of steps is an electrical ground short circuit and the anomaly obtained by the second block (B2) of steps is no anomaly detected, then the proven anomaly is a short circuit at the inductive load (12), the anomaly obtained by the first block (B1) of steps is a power supply short circuit and the anomaly obtained by the second block (B2) of steps is no anomaly detected, then the proven anomaly is a short circuit at the inductive load (12).

Figure 2:
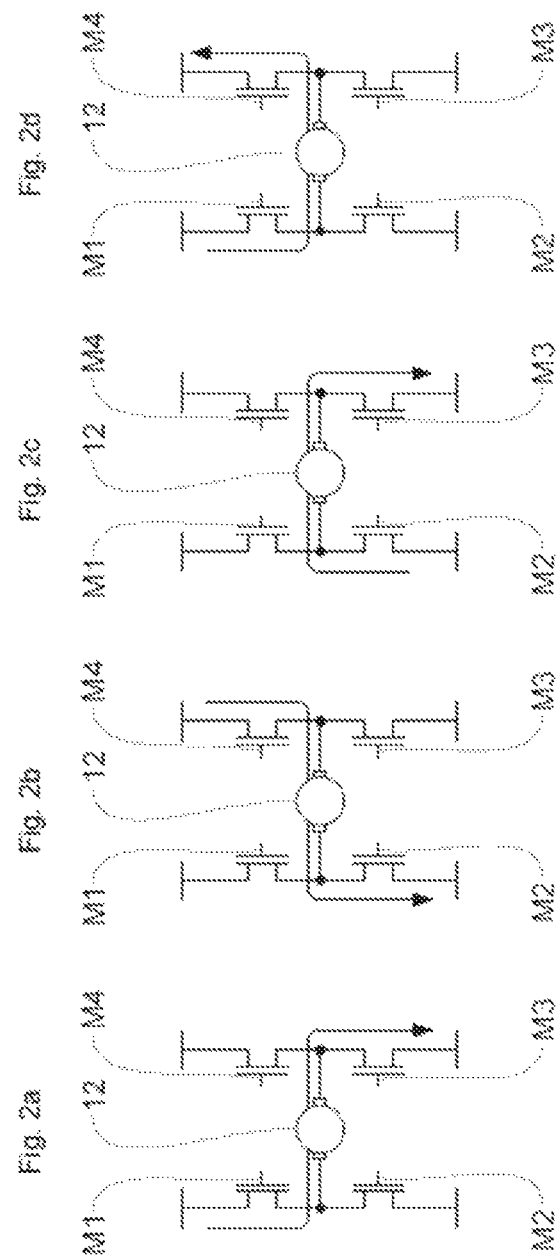
Figure 3:
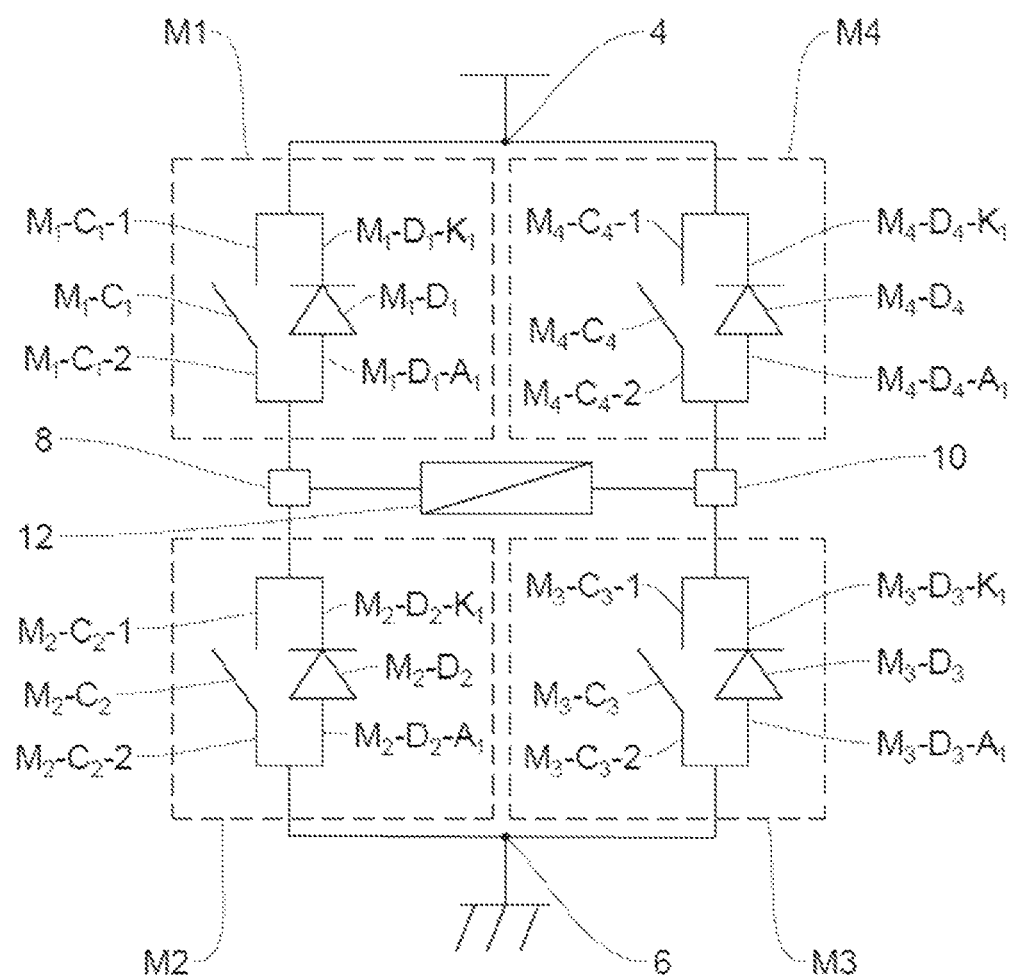
Figure 4:
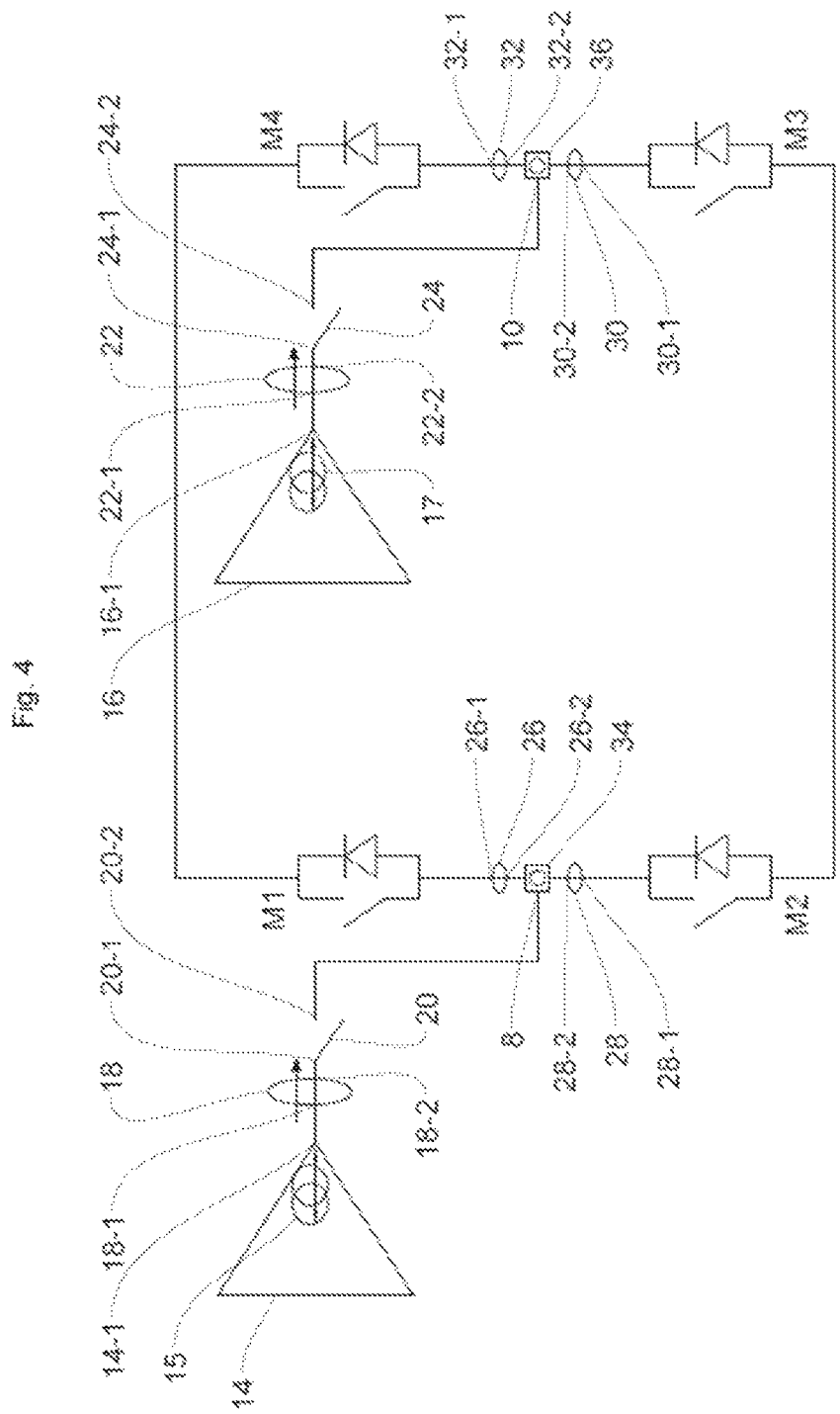
Figure 5:
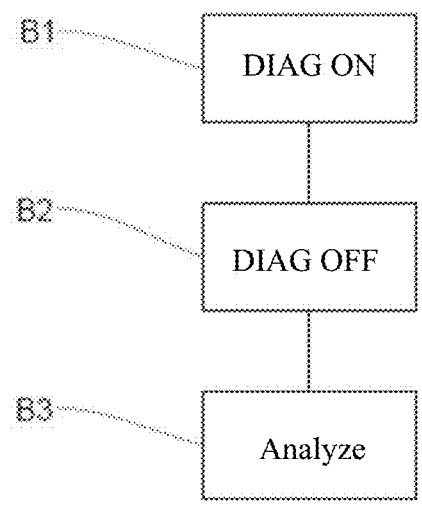
Figure 6:
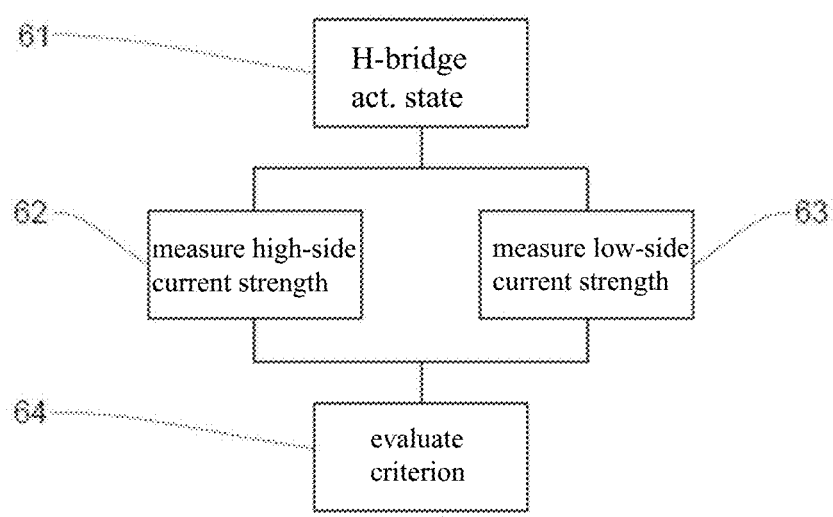
Figure 7:
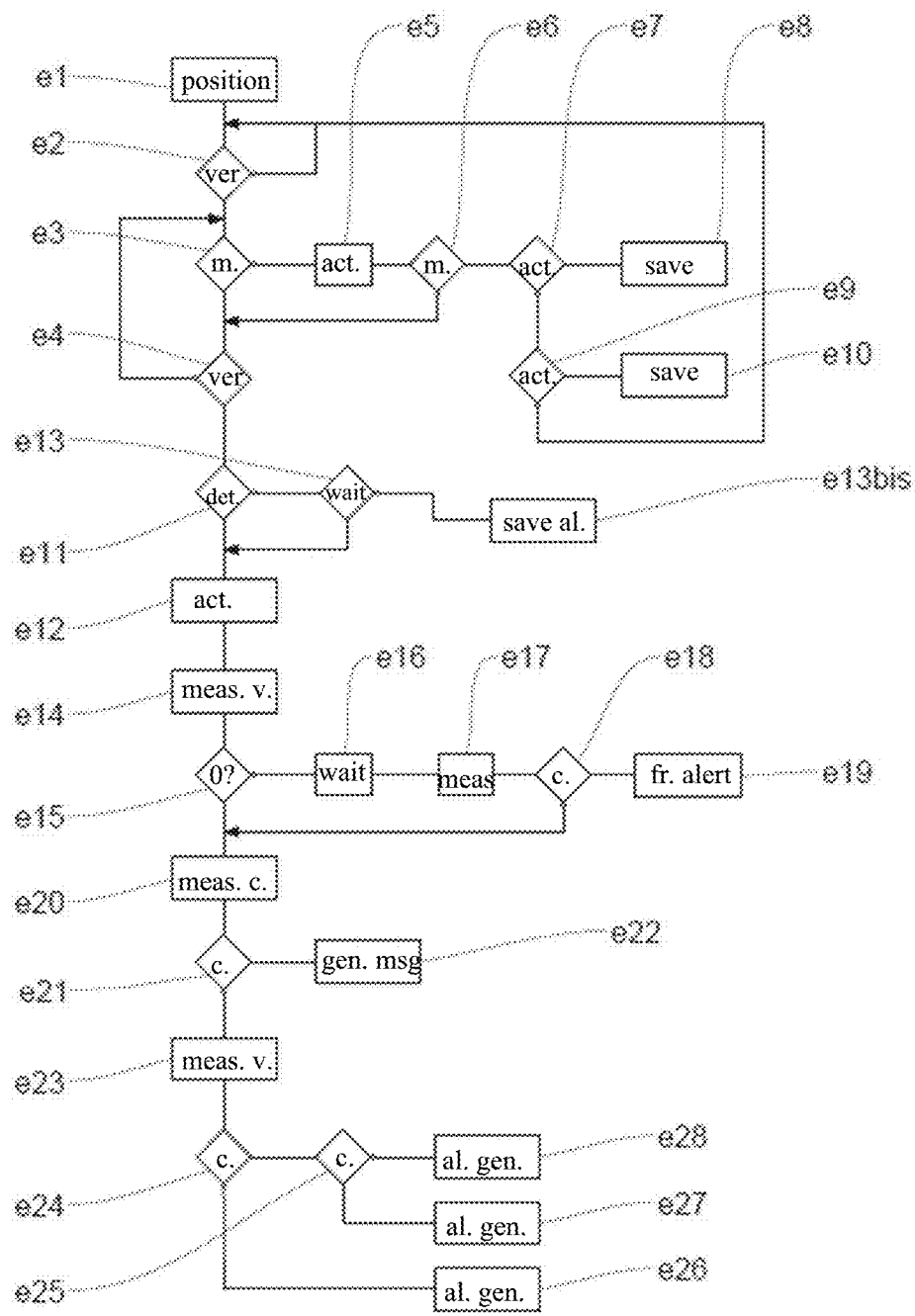

Other features and advantages of the invention will become more apparent upon reading the following description. This description is purely illustrative and should be read with reference to the appended drawings, in which:

FIG. 1 is a circuit diagram of one example of a switching structure comprising an H-bridge, FIGS. 2a, 2b, 2c and 2d are diagrams illustrating configurations for controlling an inductive load using the H-bridge of FIG. 1, FIG. 3 is an equivalent circuit diagram of the transistors of the H-bridge in an off state, FIG. 4 is a measuring device according to the invention, FIG. 5 is a flowchart of the method according to the present invention, FIG. 6 is a detailed flowchart of part of the method of the FIG. 5, and FIG. 7 is a detailed flowchart of another part of the method of the FIG. 5.

FIG. 1 shows a structure of a typical H-bridge 2, which comprises, inter alia, four power switches each formed for example of a power MOS ("metal-oxide semiconductor") transistor. The H-bridge 2 is coupled to a positive power supply via a first terminal 4 and to a negative power supply via a second terminal 6. The positive power supply may be a battery of a motor vehicle delivering a voltage +Vbat, and the negative power supply may be an electrical ground of the battery and/or of the motor vehicle. The H-bridge 2 furthermore comprises a first control output 8 and a second control output 10. An inductive load 12 is coupled between the first control output 8 and the second control output 10. The inductive load 12 is an electric motor, for example.

The H-bridge 2 also comprises a first transistor M1 coupled between the first terminal 4 and the first control output 8; a second transistor M2 coupled between the second terminal 6 and the first control output 8; a third transistor M3 coupled between the second terminal 6 and the second control output 10, and lastly a fourth transistor M4 coupled between the first terminal 4 and the second control output 10. The first transistor M1 and the fourth transistor M4 may also be called high-side transistors. The second transistor M2 and the third transistor M3 may also be called low-side transistors.

To control the inductive load 12, a first analog signal S1, a second analog signal S2, a third analog signal S3 and lastly a fourth analog signal S4 are applied to the transistors M1 to M4, respectively. The H-bridge 2, through the state of the transistors M1 to M4, thus controls the inductive load 12.

The analog signals S1 to S4 originate from a control signal (not shown in the figures) having a variable duty cycle, or also called initial PWM ("pulse width modulation") signal.

Depending on the state of the initial PWM signal and therefore on the state of the analog signals S1 to S4, the H-bridge 2 is preferably able to be controlled in accordance with three possible states or configurations, described below with reference to FIGS. 2a, 2b and 2c.

In a first activation state, the pair formed of the first transistor M1 and of the third transistor M3 makes it possible, when these transistors are in the on state (switches closed), to channel a current through the inductive load 12 in a first direction, from the positive supply voltage +Vbat to electrical ground, as indicated by an arrow in FIG. 2a. The second transistor M2 and the fourth transistor M4 are then in the off state (switches open).

By contrast, in a second activation state, the pair formed of the second transistor M2 and of the fourth transistor M4 makes it possible, when these transistors are in the on state (switches closed), to channel a current through the inductive load 12 in the other direction, still from the positive power supply +Vbat to electrical ground, as indicated by the arrow in FIG. 2b. The first transistor M1 and the third transistor M3 are then in the off state (switches open).

Lastly, in a third activation state illustrated by FIG. 2c, the first transistor M1 and the fourth transistor M4 are in the off state (switches open) and the second transistor M2 and the third transistor M3 are in the on state (switches closed). This makes it possible to evacuate the power accumulated in the inductive load 12, in the form of a current flowing to electrical ground through the second transistor M2 and the third transistor M3, as shown by the two arrows in FIG. 3c. The direction of the current is then imposed by the inductive load 12. This state is called a "freewheeling" state. It is able to be controlled following operation of the H-bridge 2 in the first activation state or the second activation state, mentioned above, after the opening of the first transistor M1 or of the fourth transistor M4, respectively.

It should be noted that the freewheeling state described above and shown in FIG. 2c may also be produced using other means. Specifically, it is also possible to use structural diodes, making it possible to have a single transistor in the on state.

However, the H-bridge 2 may also be put into a fourth activation state, illustrated by FIG. 2d. In this fourth activation state, the first transistor M1 and the fourth transistor M4 are in the on state (switches closed) and the second transistor M2 and the third transistor M3 are in the off state (switches open). This makes it possible to evacuate the power accumulated in the inductive load 12, in the form of a current flowing to the positive power supply +Vbat, through the first transistor M1 and the fourth transistor M4, as shown by the two arrows in FIG. 2d. This state is called a "high-side" freewheeling state. It is able to be controlled following operation of the H-bridge 2 in the first activation state or the second activation state, mentioned above, after the opening of the second transistor M2 or of the third transistor M3, respectively. The direction of the current is then imposed by the inductive load 12.

By contrast, other configurations of the H-bridge 2 are prohibited, such as for example a configuration in which the first transistor M1 and the second transistor M2 would be in the on state, so as to avoid connecting the positive power supply through the first terminal 4 to electrical ground through the second terminal 6 of the H-bridge 2. Other configurations are also prohibited, and will be presented later on.

It will be appreciated that the invention is not limited to this type of switching structure. In particular, it also applies to a half-bridge switching structure, that is to say with just two power MOS transistors, and after having reconstructed an H-bridge from two half-bridges. Also, the embodiment of the power switch or switches shown in FIGS. 2a, 2b, 2c and 2d is merely a nonlimiting example. These switches may each comprise a type of transistor other than the transistor, such as for example a bipolar junction transistor (BJT) or an insulated-gate bipolar transistor (IGBT) rather than a MOS transistor. They may also comprise an assembly of such transistors, possibly with other components such as resistors, capacitors, etc.

When the inductive load 12 is controlled by the H-bridge 2, it may short-circuit when there is a fault, thereby causing a short circuit between the first control output 8 and the second control output 10.

The present invention proposes an original measuring device and a method for controlling the H-bridge 2 that is capable of discriminating, from among detected anomalies, a short circuit of the inductive load 12 coupled between the two control outputs 8 and 10 of the H-bridge 2 anomaly.

To this end, the present invention furthermore proposes original techniques for measuring electrical parameters on the H-bridge 2, as illustrated in FIG. 3. The example illustrated in FIG. 3 is a symbolic view of the H-bridge 2 and its associated connections; in no case is this view limiting with regard to the scope of the invention. In the remainder of the description, the four transistors M1 to M4 may also be called switches M1 to M4.

As those skilled in the art are aware, a transistor, for example a MOS transistor, in an off state may also be symbolized by a switch in an open position coupled in parallel to a diode that is representative of the leakage current of said MOS transistor.

The first transistor M1 is thus now represented in FIG. 3 by a first switch M1_C1, in the open position, and a first diode M1_D1. The first switch M1_C1 comprises a first terminal M1_C1_1 and a second terminal M1_C1_2. The first diode M1_D1 comprises a first cathode M1_D1_K1 and a first anode M1_D1_A1. The first terminal M1_C1_1 is coupled to the first cathode M1_D1_K1 and represents a drain of the first transistor M1. The second terminal M1_C1_2 is coupled to the first anode M1_D1_A1 and represents a source of said first transistor M1.

The second transistor M2 is now represented by a second switch M2_C2, in the open position, and a second diode M2_D2. The second switch M2_C2 comprises a first terminal M2_C2_1 and a second terminal M2_C2_2. The second diode M2_D2 comprises a first cathode M2_D2_K1 and a first anode M2_D2_A1.

The first terminal M2_C2_1 is coupled to the first cathode M2_D2_K1 and represents a drain of the second transistor M2.

The second terminal M2_C2_2 is coupled to the first anode M2_D2_A1 and represents a source of said second transistor M2.

The third transistor M3 is now represented by a third switch M3_C3, in the open position, and a third diode M3_D3. The third switch M3_C3 comprises a first terminal M3_C3_1 and a second terminal M3_C3_2. The third diode M3_D3 comprises a first cathode M3_D3_K1 and a first anode M3_D3_A1. The first terminal M3_C3_1 is coupled to the first cathode M3_D3_K1 and represents a drain of the third transistor M3. The second terminal M3_C3_2 is coupled to the first anode M3_D3_A1 and represents a source of said third transistor M3.

Lastly, the fourth transistor M4 is represented by a fourth switch M4_C4, in the open position, and a fourth diode M4_D4. The fourth switch M4_C4 comprises a first terminal M4_C4_1 and a second terminal M4_C4_2. The fourth diode M4_D4 comprises a first cathode M4_D4_K1 and a first anode M4_D4_A1. The first terminal M4_C4_1 is coupled to the first cathode M4_D4_K1 and represents a drain of the fourth transistor M4. The second terminal M4_C4_2 is coupled to the first anode M4_D4_A1 and represents a source of said fourth transistor M4.

FIG. 4 shows the diagram of the H-bridge 2 from FIG. 3 with measuring devices and associated connections in order to be able, using the method of the invention, illustrated in FIG. 5 and the following figures, to detect a short circuit of the load anomaly in a manner substantially more reliable than those from the prior art. In order to simplify the diagram of FIG. 4, the inductive load 12 is not shown.

The present invention proposes to use a first voltage generator 14 coupled to the first control output 8 and a second voltage generator 16 coupled to the second control output 10.

The first voltage generator 14 comprises a first voltage generator output 14_1 designed to deliver a controlled and modifiable DC voltage V_ref_1. In one preferred embodiment, the first voltage generator 14 also comprises a first current limiter 15. The first current limiter 15 is coupled to the first voltage generator output 141 and is designed to limit the current on the output 14_1 of the first voltage generator. Advantageously, limiting the current of the first voltage generator 14 makes it possible to avoid destruction of the H-bridge 2 when a short circuit to the positive power supply +Vbat is present, for example, but also to electrical ground, or even to prevent activation of the inductive load 12. Using such current limiters furthermore also makes it possible to limit the current in the load during the diagnostic phase a. In one exemplary embodiment, the first current limiter 15 is integrated into the first voltage generator 14.

The anomaly detection device furthermore comprises a first current measuring device 18. The latter comprises a first current measuring device input 18_1 coupled to the first voltage generator output 14_1 and a first current measuring device output 18_2.

A first circuit switch 20 comprising a first circuit switch input 20_1 and a first circuit switch output 20_2 is positioned between the first control output 8 and the first current measuring device output 18_2. Thus, in one exemplary embodiment and as illustrated in FIG. 5, the first circuit switch input 20_1 is coupled to the first current measuring device output 182, and the first circuit switch output 20_2 is coupled to the first control output 8, allowing an instantaneous measurement of the current flowing through the H-bridge 2.

The second voltage generator 16 comprises a first voltage generator output 16_1 designed to deliver a controlled and modifiable DC voltage V_ref_2. Preferably, the DC voltages V_Ref1 and V_Ref_2 have similar but different values.

In one preferred embodiment, the second voltage generator 16 also comprises a second current limiter 17. The second current limiter 17 is coupled to the second voltage generator output 16_1 and is designed to limit the current thereof.

The anomaly detection device also comprises a second current measuring device 22. The latter comprises a second current measuring device input 22_1 coupled to the second voltage generator output 16_1 and a second current measuring device output 22_2.

A second circuit switch 24 comprising a second circuit switch input 24_1 and a second circuit switch output 24_2 is positioned between the second control output 10 and the second circuit switch output 24_2. Thus, in one exemplary embodiment, the second circuit switch input 24_1 is coupled to the second current measuring device output 22_2; and the second circuit switch output 24_2 is coupled to the second control output 10.

In order to detect the current variation in each branch of the H-bridge 2 with relatively high accuracy, it is cleverly proposed to integrate additional measuring devices into the internal structure of the H-bridge 2.

Thus, as illustrated in FIG. 4, it is furthermore proposed to position a third current measuring device 26 between the first control output 8 and the first transistor M1. The third current measuring device 26 has a third current measuring device input 26_1 coupled both to the second terminal M1_C1_2 of the first switch M1_C1 and to the first anode M1_D1_A1 of the first diode M1_D1. It furthermore has a third current measuring device output 26_2 coupled to the first control output 8.

In one preferred embodiment, the third current measuring device 26 is designed firstly to detect and deliver measurement information on the instantaneous current flowing in the branch of the H-bridge 2 where it is coupled, and secondly to detect and deliver information on the current variation in said same branch of the H-bridge 2.

Also, a fourth current measuring device 28 is connected between the first control output 8 and the second transistor M2. The fourth current measuring device 28 has a fourth current measuring device input 28_1 coupled both to the first terminal M2_C2_1 of the second switch M2_C2 and to the first cathode M2_D2_C1 of the second diode M2_D2. It also has a fourth current measuring device output 28_2 coupled to the first control output 8.

In one preferred embodiment, the fourth current measuring device 28 has the same technical features as those of the third current measuring device 26.

In addition, a fifth current measuring device 30 is connected between the second control output 10 and the third transistor M3. The fifth current measuring device 30 comprises a fifth current measuring device input 30_1 coupled both to the second terminal M3_C3_2 of the third switch M3_C3 and to the first anode M3_D3_A1 of the third diode M3_D3. It also has a fifth current measuring device output 30_2 coupled to the second control output 8.

Lastly, a sixth current measuring device 32 is also used and coupled between the second control output 10 and the fourth transistor M4. The sixth current measuring device 32 has a sixth current measuring device input 32_1 coupled both to the first terminal M4_C4_1 of the fourth switch M4_C4 and to the first cathode M4_D4_C1 of the fourth diode M4_D4. It has a sixth current measuring device output 302 coupled to the second control output 10.

The fifth current measuring device 30 and the sixth current measuring device 32 have the same technical features as for example the third current measuring device 26.

It is also proposed to position a seventh voltage measuring device 34 on the first control output 8. The seventh voltage measuring device 34 is designed firstly to measure the voltage present on the first control output 8, and secondly also to detect and measure a voltage variation on the first control output 8.

Lastly, it is proposed to position an eighth voltage measuring device 36 on the second control output 10. The eighth voltage measuring device 36 advantageously has the same technical features as the seventh voltage measuring device 34.

In one exemplary embodiment, the abovementioned voltage and/or current measuring devices are devices external to the circuit of the H-bridge 2.

In another exemplary embodiment, the abovementioned voltage and/or current measuring devices are integrated partially (some of the measuring devices) into the circuit of the H-bridge 2. As an additional variant, they may be integrated fully into the circuit of the H-bridge 2.

The method for detecting a short circuit of the inductive load 12 anomaly according to the present invention will now be presented. The steps of the method according to the present invention are shown on the flowchart of FIG. 5. Cleverly, the method of the invention combines firstly a detection method known from the prior art, generally called anomaly detection method for switches in the "ON" state, or also known by the acronym "DIAG ON", and secondly a novel anomaly detection method for switches in the "OFF" state, or also known by the acronym "DIAG OFF", which is significantly more efficient than those from the prior art.

The method of the invention therefore comprises a first block B1 of steps of the method for detecting an anomaly using the method called "DIAG ON", a second block B2 of steps of the method for detecting an anomaly using the method called "DIAG OFF", and lastly a third block B3 of method steps for discriminating the detected anomaly and cleverly confirming a short circuit at the inductive load 12 anomaly. Thus, by virtue of combining these two types of diagnostic methods, that is to say "DIAG ON" and "DIAG OFF", it is possible to have detection of a short circuit of the inductive load 12 anomaly that is more reliable.

With regard to the first block B1 of steps, this is cleverly a "DIAG ON" diagnostic method known to those skilled in the art that makes it possible, inter alia, to detect a short circuit at the inductive load 12 anomaly.

As illustrated in FIG. 6, the "DIAG ON" diagnostic method first of all comprises a step 61 of putting the H-bridge 2 into an activation state from among the first activation state or the second activation state. After the H-bridge 2 has been put into one of the two activation states, the "DIAG ON" diagnostic method comprises a step 62 of measuring successive values of the strength of a high-side current flowing in the high-side switch M1, M4 in the on state of the H-bridge 2. The high-side current flowing in the switch M1 is measured for example by the third current measuring device 26, and the high-side current flowing in the switch M4 is measured by the sixth current measuring device 32.

The method then comprises a step 63 of measuring successive values of the strength of the low-side current flowing in the low-side switch M2, M3 in the on state of the H-bridge 2. The low-side current flowing in the switch M2 is measured for example by the second current measuring device 28, and the low-side current flowing in the switch M3 is measured by the fifth current measuring device 30.

The method then comprises a step 64 of evaluating a criterion for detecting an overcurrent of the low-side current or of the high-side current on the basis of the measured values.

If the activation state corresponds to the first activation state corresponding to the diagram in FIG. 2*a*, then the high-side current measured is the one flowing in the high-side switch M1, and the low-side current measured is the one flowing in the low-side switch M3.

If the activation state corresponds to the second activation state corresponding to the diagram in FIG. 2*b*, then the high-side current measured is the one flowing in the high-side switch M4, and the low-side current measured is the one flowing in the low-side switch M2.

Step 62 of measuring the high-side current and step 63 of measuring the low-side current are for example executed simultaneously. However, there is nothing to rule out executing step 62 of measuring the high-side current and step 63 of measuring the low-side current at different respective times.

In principle, in the event of a short circuit on the inductive load 12, the strength of the high-side current and the strength of the low-side current both increase rapidly and simultaneously so as to exhibit an overcurrent. The evaluation of the detection criterion aims to verify whether the strength of the high-side current or of the low-side current reaches an excessively high value, liable to be caused by a short circuit on the inductive load 12. If the strength of the current evaluated from among the high-side current and the low-side current reaches a value considered to be excessively high, then the detection criterion is considered to be verified.

If not (the strength of the current evaluated from among the high-side current and the low-side current is not considered to be excessively high), the detection criterion is not verified and the measurements of the strength of the high-side current and of the strength of the low-side current may continue, and therefore the H-bridge 2 is considered to be the inductive load 12 in a normal operating state.

Generally, any type of detection criterion may be implemented, as long as it makes it possible to verify whether the strength of a current becomes excessively high, and the choice of a particular detection criterion constitutes only a variant embodiment of the invention.

As those skilled in the art are aware, in the event of an overcurrent being detected, the electronic components of the H-bridge 2 are stopped (in particular the high-side switches and the low-side switches may be put into an off state). As the case may be, it is no longer relevant to measure the strengths of the low-side current and of the high-side current.

Thus, by virtue of the "DIAG ON" anomaly detection method of the first block B1 of steps of the method according to the present invention, it is possible to detect a short circuit to electrical ground, a power supply short circuit and a short circuit of the inductive load 12. However, as those skilled in the art are aware, this type of diagnosis does not make it possible to obtain a sufficient degree of certainty with regard to the anomaly detection.

In order to improve the detection of an anomaly, the method of the invention proposes, following the first block B1 of steps and if the latter has detected an overcurrent, to execute the second block B2 of steps consisting in diagnosing the switches M1 to M4 in an "OFF" or "DIAG OFF" state. The "DIAG OFF" method according to the present invention comprises, as illustrated in FIG. 7, a first step e1 during which the first transistor M1, the second transistor M2, the third transistor M3 and the fourth transistor M4 are put into an off state. The transistors are put into an off state for example by setting the first analog signal S1, the second analog signal S2, the third analog signal S3 and the fourth analog signal S4 to "0". Of course, those skilled in the art will understand the concept of the off state of a transistor to mean putting it into an open state.

In a second step e2, a step of verifying the state of the transistors M1 to M4 is performed. If the four transistors M1 to M4 are indeed respectively in an off state, then a third step e3 is performed. If at least one of the four transistors is not yet in an off state, then the second step e2 is executed again.

The third step e3 of the method of the present invention consists of a test for the presence or absence of a current flowing through the first control output 8 and/or the second control output 10 without using a voltage and/or current source external to the H-bridge 2. Specifically, as those skilled in the art are aware, even if the transistors M1 to M4 are in an off state, it is possible for a current to flow through the internal diodes of the transistors M1 to M4, which may be synonymous with an anomaly.

Thus, in one exemplary embodiment of the method of the invention, during this third step e3, the third current measuring device 26 is activated and interrogated by a control device, such as for example an electronic computer, in order to verify the presence or the absence of a reverse current flowing through the first transistor M1 and more precisely through its internal diode D1.

If no current is detected by the third current measuring device 26, which is synonymous with no anomaly being detected on the first transistor M1, then a fourth step e4 is executed. If a current is detected by the third current measuring device 26, then the method of the invention makes provision to move to a fifth step e5.

The fourth step e4 consists in verifying whether all of the transistors of the H-bridge 2 have been tested. If all of the transistors have been tested, then an eleventh step e11 is executed. If not (there is still at least one transistor of the H-bridge 2 to be tested), then the third step e3 is executed again on the transistor of the H-bridge 2 to be tested. Of course, the measuring devices linked to the transistor to be tested during the third step e3 will be activated accordingly.

During the fifth step e5, which is synonymous according to the invention with the possible detection of a current flowing in at least one of the transistors of the H-bridge 2, a first time counter is activated. In one exemplary embodiment of the method of the invention, said first time counter is programmable and has for example a duration of 10 ms (10 ms-0.01 s). This duration may for example correspond to the nominal discharge duration of the inductive load 12. Once the duration of 10 ms has passed, the method of the invention makes provision to move to a sixth step e6.

During the sixth step e6, a new measurement of the presence of a current flowing through said transistor, under test in the third step e3, of the H-bridge 2 is performed again. Advantageously, the actions performed here are identical to those presented in the third step e3. The method cleverly makes provision to move to the fourth step e4 if no current is detected in said transistor under test of the H-bridge 2. In addition, if a current is detected in said transistor under test, then the method of the invention makes provision to move to a seventh step e10 synonymous with the presence of at least one anomaly at the H-bridge 2.

During the seventh step e7, the current measuring devices are activated again. Cleverly, firstly the measurement of a current through the first transistor M1 and then through the fourth transistor M4 is tested, making it possible to detect the presence of a short circuit to a voltage greater than the positive voltage +Vbat anomaly, which is able to occur only on the first transistor M1 and the fourth transistor M4, which are also called high-side transistors by those skilled in the art.

Thus, for example, the third current measuring device 26 is first of all activated and interrogated in order to detect the presence of a current through the first transistor M1. If a current is detected by the third current measuring device 26, this is synonymous, according to the method of the invention, with the presence of a short circuit to a voltage greater than the positive voltage +Vbat on the first control output 8 anomaly. In this case, the method according to the present invention makes provision to move to an eighth step e8.

If no current is detected through the first transistor M1, the third current measuring device 26 is deactivated and the sixth current measuring device 32 is in turn activated in order to detect the presence of a potential current in the fourth transistor M4.

If a current is detected by the sixth current measuring device 32, this is synonymous, according to the method of the present invention, with the presence of a short circuit to a voltage greater than the positive voltage +Vbat on the second control output 10 anomaly. In this case, the method according to the present invention makes provision to move to the eighth step e8. If no current is detected through the fourth transistor M4, the sixth current measuring device 32 is deactivated and the method makes provision to move to a ninth step e9.

The eighth step e8 advantageously makes provision to save the information on the anomaly observed in the seventh step e7. For example, during the eighth step e8, the engine control computer is informed of the presence of a short circuit to the positive voltage greater than +Vbat anomaly by a dedicated memory cell being set to "1". Those skilled in the art will clearly understand that this example is given by way of illustration and is in no way limiting with regard to the scope of the invention.

As a variant, the method of the invention, after the eighth step e8, once the engine control computer has been informed of the proven anomaly, may for example position the H-bridge 2 in a protection mode.

The ninth step e9 consists in activating the other current measuring devices. Cleverly, firstly the measurement of a current through the second transistor M2 and then through the third transistor M3 is tested, in order to detect the presence of a short circuit to electrical ground anomaly, which is able to occur only on the second transistor M2 and/or the third transistor M3, which are also called low-side transistors by those skilled in the art.

Thus, for example, the fourth current measuring device 28 is first of all activated and interrogated in order to detect the presence of a current through the second transistor M2. If a current is detected by the fourth current measuring device 28, this is synonymous, according to the method of the invention, with a short circuit to a potential lower than electrical ground on the first control output 8. In this case, the method according to the present invention makes provision to move to a tenth step e10.

If no current is detected through the second transistor M2, the fourth current measuring device 28 is deactivated and the fifth current measuring device 30 is in turn activated in order to detect the presence of a potential current in the third transistor M3. If a current is detected by the fifth current measuring device 30, this is synonymous, according to the method of the invention, with a short circuit to a potential lower than electrical ground on the second control output 10. In this case, the method according to the present invention makes provision to move to the tenth step e10.

If no current is detected, then the method of the invention again moves to the second step e2.

The tenth step e10 advantageously makes provision to save the information on the anomaly observed in the ninth step e9. For example, during the tenth step e10, the engine control computer is informed of the presence of a short circuit to a potential lower than electrical ground anomaly by a dedicated memory cell being set to "1". The method furthermore makes provision, during this tenth step e10, once the engine control computer has been informed of the proven anomaly, to exit the method of the invention and for the H-bridge 2 to again be controlled in a normal operating mode.

By virtue of using the first time counter and the measurement of the current in each transistor before and after a determined duration, the risk of a diagnosis error is substantially reduced.

The method of the invention furthermore proposes to detect the presence of an electromotive force at the terminals of the first control output 8 and of the second control output 10; representative for example of a rotation resulting from the inductive load 12.

After verifying the presence of a short-circuit current in the H-bridge 2, the method makes provision, in an eleventh step e11, to sequentially or simultaneously activate the seventh voltage measuring device 34 and the eighth voltage measuring device 36 in order to record the voltage on the first control terminal 8 and on the second control voltage terminal 10. Once the two measurements have been performed, it is proposed in this eleventh step e11 to subtract the absolute values of the two recorded voltages. Thus, for example, the value of the voltage recorded on the first control voltage terminal 8 is subtracted from the value of the voltage recorded on the second control voltage terminal 10.

The method of the present invention makes provision, when the result of the subtraction is nil, that is to say equal to zero, to move to a twelfth step e12. Advantageously, this result of the comparison of the two voltages means that there is no electromotive force present on the two control outputs of the H-bridge 2 and that the inductive load 12 is therefore stationary.

If the result of said subtraction is not zero, then the method moves to a thirteenth step e13; according to the present invention, this means that a resulting electromotive force is present on the control outputs of the H-bridge 2.

In order to ensure that the electromotive force is stopped, corresponding to stoppage of the electric motor, it is cleverly proposed, in the thirteenth step e13, to apply a time delay using a second time counter, which is set for example to a value of 1 s. Once the time of 1 s has elapsed, if no electromotive force is detected, then the method according to the invention proposes to move to the twelfth step e12, and otherwise an electromotive force anomaly alert is saved in a dedicated memory in a step e13 bis).

Thus, by virtue of the method of the invention, it is possible to avoid potential detection of an anomaly that has not been proven on at least one control output terminal of the H-bridge 2 that is caused by the presence of an electromotive force present on said control output terminals 8 and 10.

Advantageously, it is now possible to make an improved diagnosis of the presence of at least one anomaly on at least one of the transistors of the H-bridge 2. Specifically, the state of the four transistors is known and fixed, as is the absence of an electromotive force on at least one of the control output terminals of the H-bridge 2.

In the twelfth step e12 of the method of the invention, the first voltage generator 14 and the second voltage generator 16 are now activated. In order for the first voltage $V\_ref\_1$ delivered by the first voltage generator output 14_1 to be applied to the first control output terminal 8 of the H-bridge 2, the first circuit switch 20 is activated, for example in one embodiment of the invention.

Likewise, with regard to the application of the second reference voltage $V\_ref\_2$, the second voltage generator 16 is activated during this same twelfth step e12. In order for the second reference voltage $V\_ref\_2$ to be applied to the second control terminal 10, the second circuit switch 24 is activated.

Once the voltage sources have been activated and the voltages have been applied to the two output terminals of the H-bridge 2, a fourteenth step e14 is executed.

In this fourteenth step e14, a variation in the voltage $V\_out\_1$ at the first control terminal 8 is measured using the seventh voltage measuring device 34. To measure the variation in the voltage $V\_out\_1$, for example, a first measurement of the voltage $V\_out\_1$ is performed and is stored in a dedicated memory space, and then, after a settable and determined duration, for example 100 μs, a second measurement of the voltage $V\_out\_1$ is performed. The two values are compared and a slope is deduced therefrom through a mathematical calculation that is known to those skilled in the art.

In another variant embodiment of the method, the seventh voltage measuring device 34 automatically performs and determines the measurement of the slope of the voltage $V\_out\_1$. Those skilled in the art are well aware of these automated measuring techniques.

During this fourteenth step e14, the slope of the output voltage $V\_out\_2$ is also measured. In one exemplary embodiment, the same measuring technique as the one for the first output voltage $V\_out\_1$ is used. Furthermore, for example, the time gaps between two measurements of the output voltages are identical. In one exemplary embodiment, the output voltages are measured simultaneously.

Once the two slopes have been deduced and/or measured, the method makes provision to move to a fifteenth step e15.

In the fifteenth step e15, if at least one of the two slopes is non-zero, then the method makes provision to execute a sixteenth step e16, and if the two slopes are zero, then the method makes provision to execute a twentieth step e20.

During this sixteenth step e16, a third time counter is activated. The duration may be settable and has for example a value of 10 ms. Once the duration has elapsed, the method moves to a seventeenth step e17.

During this seventeenth step e17, the same measurements as in the fourteenth step e14 are performed in order to collect a second slope of the first output voltage $V\_out\_1$ and of the second output voltage $V\_out\_2$. The method then makes provision to move to an eighteenth step e18.

The eighteenth step e18 consists in comparing the two slopes of the output voltages $V\_out\_1$ and $V\_out\_2$, and the result is for example stored in a memory. If at least one of the two results of comparing the slopes of the first output voltage $V\_out\_1$ or of the second output voltage $V\_out\_2$ is non-zero (which means a voltage variation), then the method makes provision to move to a nineteenth step e19. If no variation is observed, then the method makes provision to move to the twentieth step e20.

The nineteenth step e19 consists in generating a frequency interference alert at the engine control computer, for example. Specifically, in this case, according to the method of the invention, an anomaly, for example electromagnetic coupling to one of the two outputs at the H-bridge 2, is present. In one exemplary embodiment, the method of the invention then makes provision, after the nineteenth step e19, to end the execution of the method of the invention and therefore for example to control the H-bridge 2 normally.

In the twentieth step e20, the first current measuring device 18 is activated and the current flowing through it, for example called I_out_1, is measured. The recorded value is for example stored in a memory dedicated for this purpose. Likewise, during this twentieth step e20, the second current measuring device 20 is activated and the current I_out_2 flowing through it is measured. The recorded value I_out_2 is itself also stored in a dedicated memory.

Cleverly, during a twenty-first step e21, the two current values I_out_1 and I_out_2 are compared. This comparison may be performed by a computer.

When the result of the comparison between the values I_out_1 and I_out_2 is almost identical or for example within a difference of a value of the order of 2% of the absolute value of the current I_out_1, then, according to the method of the invention, this means that there is no anomaly observed at the H-bridge 2, and that, accordingly, the H-bridge 2 is in a normal operating state. The method of the invention thus makes provision, in this scenario, to move to a twenty-second step e22.

Cleverly, there is provision for the values of the two output currents to be substantially different due to the connections and the components that are coupled to the first control output 8 and to the second control output 10. This variation may stem from a resistor coupled to a single control output, and which therefore causes a variation in the output currents. In addition, capacitors may also be coupled to at least one output, such as for example a filtering capacitor. This capacitor may thus also create interference at at least one control output of the H-bridge 2. Advantageously, by virtue of this tolerance with regard to the values of the output current, it is possible, unlike the prior art, to avoid potential errors in the diagnosis.

If the two output current values are outside the desired measurement range, for example 2% of the absolute value of the current I_out_1, then the method makes provision to move to a twenty-third step e23.

During the twenty-second step e22, the method of the invention makes provision for example to generate a message to the microcontroller regarding the correct operation of the H-bridge 2, synonymous with no short circuit or open circuit anomaly.

During the twenty-third step e23, the values of the output voltages V_out_1 and V_out_2 are recorded by the seventh voltage measuring device 34 and by the eighth voltage measuring device 36.

During a twenty-fourth step e24, the two values are compared. The method makes provision to move to a twenty-fifth step e25 if the comparison result is within a difference between +/−2% of the absolute value of a measurement of an output voltage, for example V_out_1, and if the result of the comparison is greater, the method makes provision to move to a twenty-sixth step e26.

During the twenty-fifth step e25, the value of the output voltage V_out_1 and of the reference voltage Vref1 are compared. If the first measured output voltage V_out_1 is greater than the reference voltage V_ref1 and than the reference voltage V_ref2, then the method moves to a twenty-seventh step e27. If the first output voltage V_out_1 is lower than the reference voltage V_ref1 and than the reference voltage V_ref2, then the method moves to a twenty-eighth step e28.

During the twenty-seventh step e27, an alert is generated to the engine control computer stipulating that an anomaly is detected and is a battery short circuit anomaly. The method of the invention is then for example stopped and the H-bridge 2 may again be controlled by the engine control computer for example.

During the twenty-eighth step e28, an alert is advantageously generated to the engine control computer, for example mentioning that a short circuit to electrical ground anomaly is observed at the H-bridge 2. The method of the invention is then for example stopped and the H-bridge 2 may for example be controlled again.

During the twenty-sixth step e26, an alert is generated to the engine control computer stipulating that an anomaly is detected and is a disconnected load or open circuit at the two control outputs 8, 10 anomaly. The method of the invention then furthermore makes provision to end the execution of the method of the invention and therefore for example to control the H-bridge 2 normally.

By virtue of the method of the invention and more particularly of the second block B2 of steps, it is possible to detect the presence of an anomaly or anomalies in a manner substantially more reliable than the "DIAG OFF" methods from the prior art.

Cleverly, the method of the invention proposes to record the results of the diagnostics of the "DIAG ON" method that are performed during the execution of the first block B1 of steps and the results of the diagnostics of the "DIAG OFF" method that are performed during the execution of the second block B2 of steps in a dedicated memory space, for example a memory space of the microcontroller responsible for managing said H-bridge 2.

Table 1 below illustrates the possible cases able to be detected during the execution of the first block 1 of steps and the execution of the second block 2 of steps.

TABLE 1

|  |  | ON state diagnosis | | |
| --- | --- | --- | --- | --- |
|  |  | Electrical ground short circuit | Power supply short circuit | Load short circuit |
| OFF state diagnosis | Electrical ground short circuit | Electrical ground short circuit | X | Load short circuit |
|  | Power supply short circuit | X | Power supply short circuit | Load short circuit |
|  | No short circuit or open circuit anomaly | Load short circuit | Load short circuit | Load short circuit |

Cleverly, the method of the invention, during the execution of the third block B3 of steps, analyzes the results of the anomaly detection performed during the first block B1 of steps and during the second block B2 of steps shown in table 1, making it possible to improve the reliability of the diagnosis of the presence of a short circuit at the inductive load 12.

Thus, if, during the execution of the first block B1 of steps, a diagnosis corresponding to an electrical ground short circuit at one of the two high-side switches M1 or M4 is fed back and, during the execution of the second block B2 of steps, the same diagnosis is fed back, that is to say an electrical ground short circuit at one of the two high-side switches M1 or M4, then it is possible to confirm, by virtue of the method of the invention, that the detected electrical ground short circuit at one of the two switches M1 or M4 anomaly is proven.

If, during the execution of the first block B1 of steps, a diagnosis corresponding to a power supply short circuit at one of the two low-side switches M2 or M3 is fed back and, during the execution of the second block B2 of steps, the same diagnosis is fed back, that is to say a power supply short circuit at one of the two low-side switches M2 or M3, then it is possible to confirm, by virtue of the method of the invention, that the detected power supply short circuit at one of the two low-side switches M2, M3 anomaly is proven.

If, during the execution of the first block B1 of steps, a diagnosis corresponding to an electrical ground short circuit at one of the two switches M1, M4 is fed back and, during the execution of the second block B2 of steps, an absence of an anomaly diagnosis is fed back, that is to say no short circuit or open circuit anomaly, then it is possible to confirm, by virtue of the method of the invention, that the detected short circuit of the inductive load 12 anomaly is proven.

If, during the execution of the first block B1 of steps, a diagnosis corresponding to a power supply short circuit at one of the two switches M2, M3 is fed back and, during the execution of the second block B2 of steps, an absence of an anomaly diagnosis is fed back, that is to say no short circuit or open circuit of the inductive load 12 anomaly, then it is possible to confirm, by virtue of the method of the invention, that the detected short circuit of the inductive load 12 anomaly is proven.

If, during the execution of the first block B1 of steps, a diagnosis corresponding to a short circuit of the inductive load 12 is fed back and, during the execution of the second block B2 of steps, an absence of an anomaly diagnosis is fed back, that is to say no short circuit or open circuit of the inductive load 12 anomaly, then it is possible to confirm, by virtue of the method of the invention, that the diagnosis of the presence of a short circuit of the inductive load 12 is proven.

The cases in table 1 that are not presented do not provide any further confirmation, so they will not be described in more detail here.

By virtue of the method of the invention, it is now possible to detect the presence of a short circuit at the load of the H-bridge 2 in a manner substantially more reliable than the prior art.

Furthermore, the method of the present invention has a significantly faster execution time than that from the prior art.

Of course, the present invention is not limited to the preferred embodiment described above and illustrated in the drawing and to the variant embodiments mentioned, but extends to all variants within the scope of those skilled in the art.

The invention claimed is:

1. A method for supplying power to an inductive load using an H-bridge power supply structure including at least four transistors each including at least one switch, and at least one control output coupled to at least two transistors of the at least four transistors, the method comprising:
   detecting a first anomaly that is one of a power supply short circuit, an electrical ground short circuit, and a short circuit at the inductive load, and an overcurrent using a DIAG ON diagnostic method in which two respective switches of two transistors of the at least four transistors are in an on state;
   obtaining a result that is one of: (i) detecting a second anomaly that is one of the power supply short circuit and the electrical ground short circuit, and (ii) failing to detect a presence of the power supply short circuit and the electrical ground short circuit using a DIAG OFF diagnostic method in which the at least four transistors are in an off state, after the detecting the first anomaly and the overcurrent by measuring a presence of a current flowing through the at least one control output without using one or more of a voltage and a current source external to the H-bridge power supply structure;
   comparing the detected first anomaly with the obtained result using the DIAG OFF diagnostic method;
   confirming an anomaly diagnosis corresponding to one of the power supply short circuit and the electrical ground short circuit, when the detected first anomaly and the obtained result using the DIAG OFF diagnostic method are determined to match, as a result of the comparing; and
   confirming the short circuit at the inductive load, when the detected first anomaly and the obtained result using the DIAG OFF diagnostic method are not determined to match, as a result of the comparing.

2. The method for supplying power to the inductive load as claimed in claim 1, wherein the at least two transistors comprise a first transistor, a second transistor, a third transistor, and a fourth transistor, and
   wherein the detecting the first anomaly comprises:
      putting the H-bridge power supply structure into one of a first activation state in which the first transistor and the third transistor of the H-bridge power supply structure are in the on state and the second transistor and the fourth transistor of the H-bridge power supply structure are in an off state, and a second activation state in which the second transistor and the fourth transistor of the H-bridge power supply structure are in the on state and the first transistor and the third transistor of the H-bridge power supply structure are in the off state,
      measuring successive values of the strength of a high-side current flowing in a high-side switch of the at least two switches in the on state of the H-bridge power supply structure,
      measuring successive values of the strength of a low-side current flowing in a low-side switch of the at least two switches in the on state of the H-bridge power supply structure, and
      evaluating a criterion to detect the overcurrent of the low-side current or the high-side current based on the measured values.

3. The method for supplying power to the inductive load as claimed in claim 2, further comprising recording the type of anomaly detected in relation to the overcurrent of the low-side current or the high-side current that is detected.

4. The method for supplying power to the inductive load as claimed in claim 1, wherein the DIAG OFF diagnostic method comprises the following steps:
   e1) positioning the switches of the H-bridge power supply structure in an off state,
   e2) verifying and awaiting the off state of all of the switches,
   e3) sequentially measuring a current flowing through each of the switches when there is no current flowing through all of the switches, then moving to step e11) when at least one current is flowing through at least one of the switches,
   awaiting a first determined duration before performing a new measurement of the current flowing through each of the switches, then, when there is at least one current in at least one of the switches, then identifying whether one of two of the switches that are coupled to the positive power supply is being flowed through by said measured current, when one of said two switches is being flowed through by said current, moving to step e8), when neither of said two switches is being flowed through by a current, then identifying whether one of the two switches coupled to electrical ground is being flowed through by said measured current, and when one of said two switches is being flowed through by said current, moving to step e10), e8) confirming the presence of a short circuit to a voltage level higher than a battery anomaly at at least one of the two high-side switches, e10) confirming the presence of a short circuit to a voltage level lower than a ground anomaly at at least one of the two low-side switches, e11) detecting the presence of an electromotive force between the first control output and the second control output by measuring the voltages on the first control output and the second control output, when the measured voltages are equal, moving to step e12), and when the measured voltages are different, then recording the difference between the first control output and the second control output corresponding to the electromotive force to control the connected load, awaiting a second determined duration before a new step of measuring the voltages on the first control output and the second control output, when the measured voltages have equal values, then moving to step e12), and otherwise implementing an alert, e12) coupling a first voltage generator and a second voltage generator to said control outputs, and then respectively applying a first voltage and a second voltage, e14) measuring the voltages on the first control output and the second control output, when the measured voltage variations over time are outside a first measurement range, moving to step e16), and when the measured voltage variations are within the first measurement range, moving to step e20), e16) awaiting a third determined duration before measuring the voltages on the first control output and the second control output again, when the measured voltage variations are again outside the first measurement range, then declaring that the anomaly is a frequency interference anomaly, and when the measured voltage variations are within the first measurement range, moving to step e20), e20) measuring the currents flowing through the first control output and the second control output, when the difference between the two measured currents is within a second measurement range, then stopping the anomaly test and declaring no short circuit or open circuit anomaly, and when the difference between the two measured current is not within the second measurement range, then moving to step e23), e23) measuring the voltages of the two outputs, and when the voltage measured on the first control output is different from the voltage measured on the second control output, then the detected anomaly is determined to be an open load anomaly, and stopping the execution of the method, and when the voltage measured on the first control output is not different from the voltage measured on the second control output, moving to step e25), and e25) measuring the voltages on the first control output and the second control output, and when the measured voltages are greater than the voltages generated by the voltage generators connected to the outputs, then generating an alert regarding the presence of a short circuit to the positive voltage, and when the measured voltages are lower than the voltages generated by the voltage generators connected to the outputs, then generating an alert regarding the presence of the electrical ground short circuit.

5. The method for supplying power to the inductive load as claimed in claim 4, further comprising recording the type of anomaly detected.

6. The method for supplying power to the inductive load as claimed in claim 1, wherein the short circuit at the inductive load is confirmed when the detected first anomaly detected using the DIAG ON diagnostic method is the electrical ground short circuit and the presence of the power supply short circuit and the electrical ground short circuit is not detected or an open circuit anomaly is not detected using the DIAG OFF diagnostic method, and wherein the short circuit at the inductive load is confirmed when the detected first anomaly detected using the DIAG ON diagnostic method is the power supply short circuit and the presence of the power supply short circuit and the electrical ground short circuit is not detected or an open circuit anomaly is not detected using the DIAG OFF diagnostic method.

\* \* \* \* \*